(12) United States Patent
Yoshida

(10) Patent No.: US 8,638,416 B2
(45) Date of Patent: Jan. 28, 2014

(54) DEVICE MANUFACTURING APPARATUS, INCLUDING COOLANT TEMPERATURE CONTROL, AND METHOD OF MANUFACTURING DEVICE

(75) Inventor: Tomohiko Yoshida, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 220 days.

(21) Appl. No.: 12/766,373

(22) Filed: Apr. 23, 2010

(65) Prior Publication Data

US 2010/0273114 A1 Oct. 28, 2010

(30) Foreign Application Priority Data

Apr. 23, 2009 (JP) ................................. 2009-105607

(51) Int. Cl.
*G03B 27/52* (2006.01)
*G03B 27/32* (2006.01)

(52) U.S. Cl.
USPC ............................................. 355/30; 355/77

(58) Field of Classification Search
None
See application file for complete search history.

(56) References Cited

U.S. PATENT DOCUMENTS

| 7,116,396 B2 * | 10/2006 | Tsuji et al. ...................... 355/30 |
| 2006/0225876 A1 * | 10/2006 | Shimizu ......................... 165/263 |

FOREIGN PATENT DOCUMENTS

| JP | 2001-290543 A | 10/2001 |
| JP | 2003-133211 A | 5/2003 |
| JP | 2006-235205 A | 9/2006 |

* cited by examiner

*Primary Examiner* — Peter B Kim
*Assistant Examiner* — Michelle Iacoletti
(74) *Attorney, Agent, or Firm* — Rossi, Kimms & McDowell LLP

(57) ABSTRACT

A device manufacturing apparatus includes a driving unit configured to perform driving for processing an object, a conduit through which a coolant that recovers heat generated by the driving unit flows, a cooler configure to cool the coolant that flows through the conduit, a heater configured to heat the coolant cooled by the cooler so that the driving unit cooled by the heated coolant has a target temperature, and a controller configured to heighten a target temperature of the coolant cooled by the cooler, if it is determined, based on control information to control the driving unit, that a heat amount to be generated by the driving unit decreases.

9 Claims, 16 Drawing Sheets

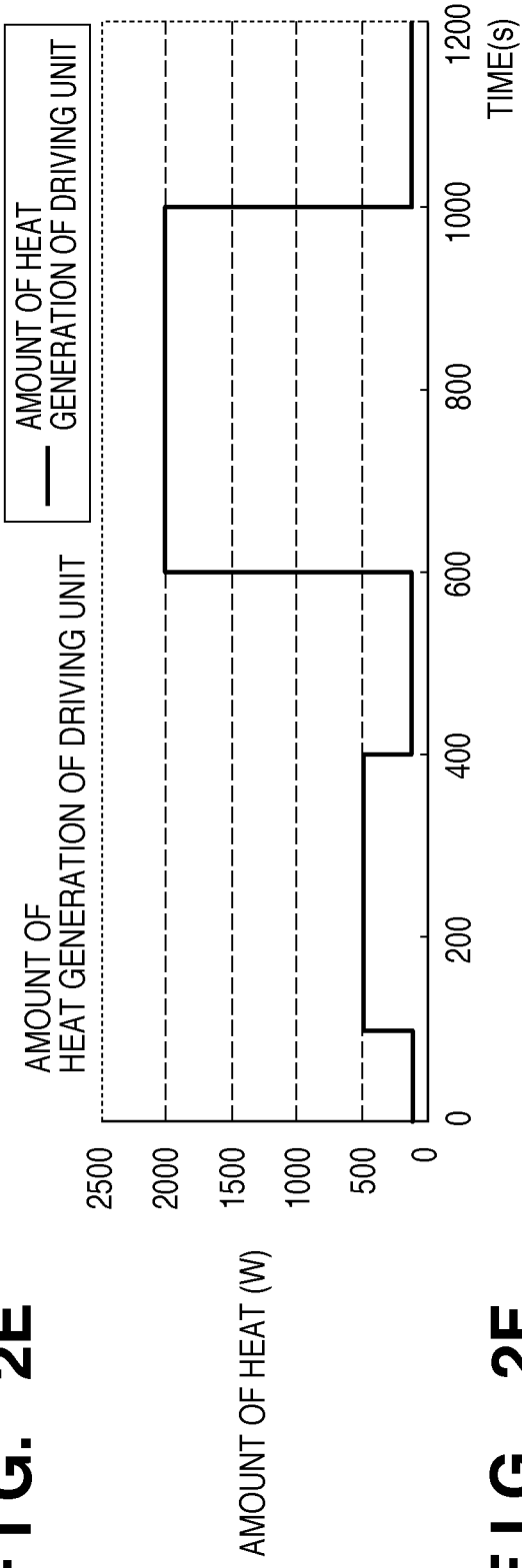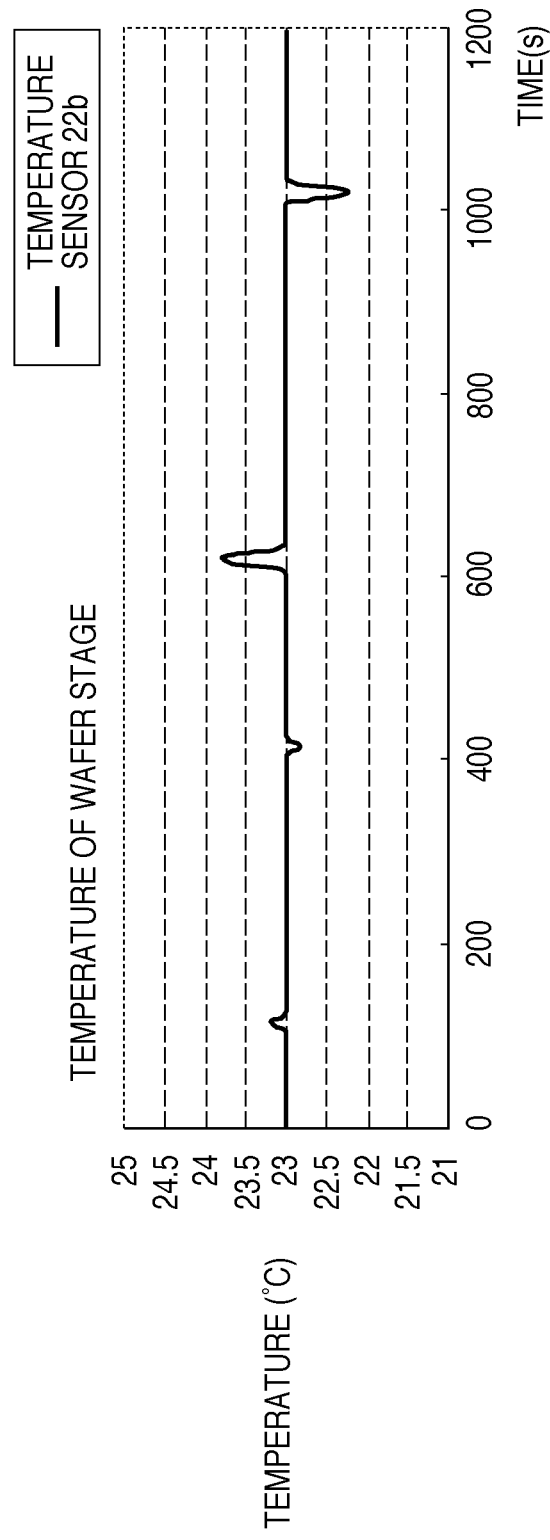

DEVICE MANUFACTURING APPARATUS, INCLUDING COOLANT TEMPERATURE CONTROL, AND METHOD OF MANUFACTURING DEVICE

BACKGROUND OF THE INVENTION

1. Field of the Invention

The present invention relates to a device manufacturing apparatus used to manufacture a device, and a method of manufacturing a device by use of the device manufacturing apparatus.

2. Description of the Related Art

An exposure apparatus is employed in the process of manufacturing various kinds of devices typified by semiconductor devices such as an LSI and display devices such as a liquid crystal display device. The exposure apparatus exposes a photosensitive agent applied on a substrate to radiant energy such as light or charged particle beam by, for example, projecting a pattern of a mask (original) onto the substrate. The substrate is coated with a photosensitive agent, and a latent image pattern is formed on the photosensitive agent by exposure.

As the throughput of a device manufacturing apparatus such as an exposure apparatus increases, the amount of heat generation of a driving unit (heat-generating portion) such as a linear motor, in turn, increases. The heat-generating portion is cooled using a coolant such as water, an antifreeze, or an inert liquid. A coolant whose temperature has risen as it absorbs heat generated by the heat-generating portion undergoes primary temperature regulation by a refrigerator under inverter control or hot bypass gas control or by heat exchange with cooling water supplied from the facility of the device manufacturing apparatus.

It is difficult to perform highly accurate temperature control required for the device manufacturing apparatus only by the primary temperature regulation which adopts a refrigerator or heat exchange, as described above. In view of this, secondary temperature regulation is performed near the heat-generating portion by, for example, a sophisticated heater with a high response characteristic and high precision.

Japanese Patent Laid-Open No. 2003-133211 discloses a device manufacturing apparatus that performs secondary temperature regulation in accordance with a drive command issued to a driving unit serving as a heat-generating portion.

However, Japanese Patent Laid-Open No. 2003-133211 controls to always cool a temperature control medium to a predetermined temperature by a primary temperature control unit, irrespective of whether the driving unit serving as a heat-generating portion is active, and to heat the temperature control medium again by a secondary temperature control unit. In this respect, when the driving unit is inactive, the secondary temperature control unit always heats the temperature control medium so as to compensate for the amount of heat generation of the heat-generating portion. Therefore, power is wastefully consumed for secondary temperature control.

SUMMARY OF THE INVENTION

The present invention provides, for example, a device manufacturing apparatus advantages in terms of electric power consumption required for temperature regulation of a driving unit thereof.

One of aspects of the present invention provides a device manufacturing apparatus which includes a driving unit configured to perform driving for processing an object, a conduit through which a coolant that recovers heat generated by the driving unit flows, a cooler configure to cool the coolant that flows through the conduit, and a heater configured to heat the coolant cooled by the cooler so that the driving unit cooled by the heated coolant has a target temperature, the apparatus comprising a controller configured to heighten a target temperature of the coolant cooled by the cooler, if it is determined, based on control information to control the driving unit, that a heat amount to be generated by the driving unit decreases.

Further features of the present invention will become apparent from the following description of exemplary embodiments with reference to the attached drawings.

BRIEF DESCRIPTION OF THE DRAWINGS

FIG. 2E is a chart for explaining a method of setting a target temperature corresponding to the amount of heat generation as the target temperature of the first temperature control unit;

FIG. 2F is a chart for explaining the method of setting a target temperature corresponding to the amount of heat generation as the target temperature of the first temperature control unit;

DESCRIPTION OF THE EMBODIMENTS

Embodiments of the present invention will be described below with reference to the accompanying drawings.

Figure 1:
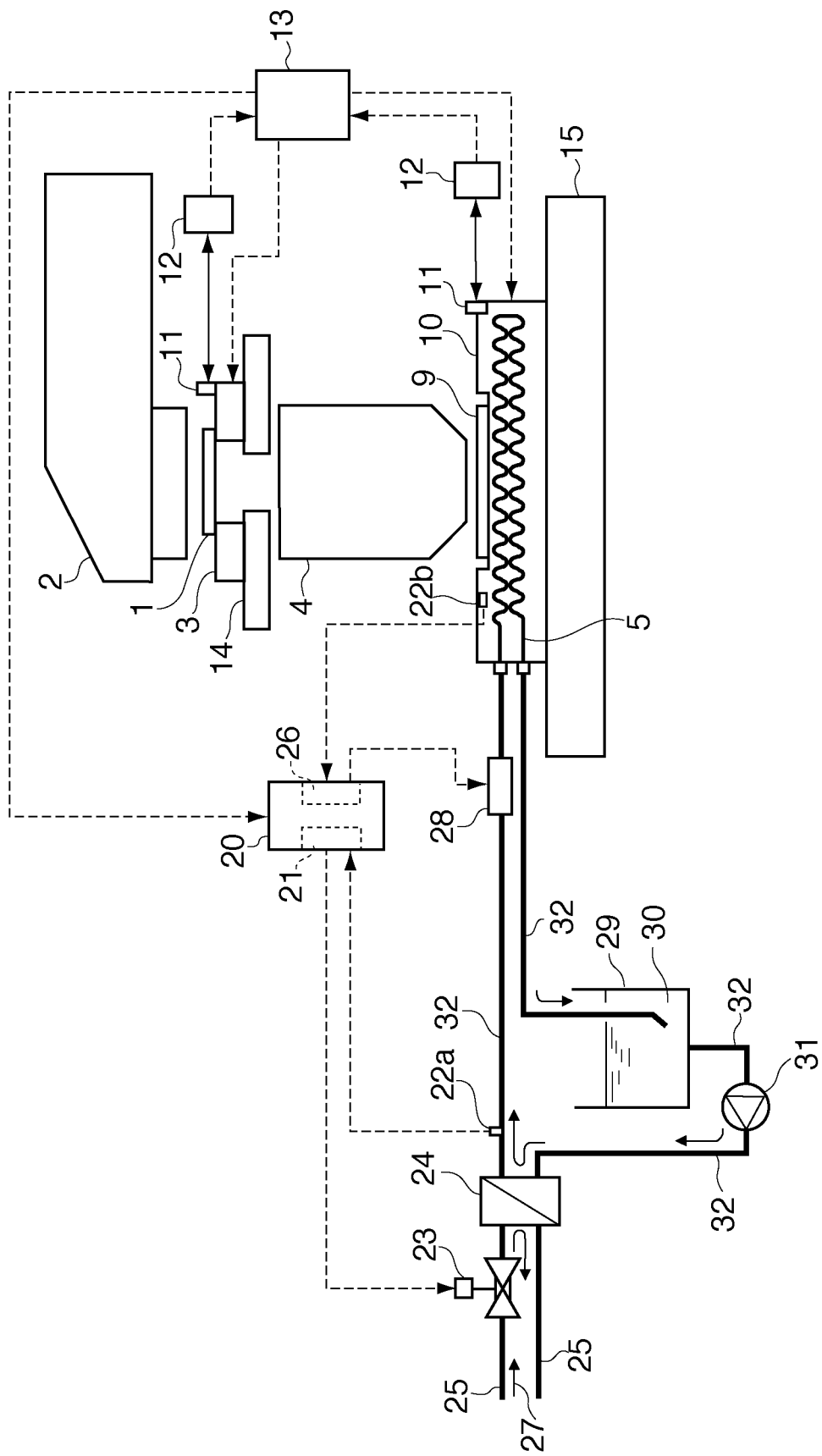
FIG. 1 is a view showing the schematic arrangement of a device manufacturing apparatus according to an embodiment of the present invention.

FIG. 1 is a view schematically showing the arrangement of a device manufacturing apparatus according to an embodiment of the present invention. This device manufacturing apparatus is configured as an exposure apparatus such as a scanner or a stepper. Referring to FIG. 1, light emitted by a light source (not shown) such as an ArF excimer laser or an $F_2$ laser is supplied to an illumination optical system 2. The illumination optical system 2 partially illuminates a reticle (original) 1 with slit light (light whose cross-sectional shape is defined by a slit) formed using the light supplied from the light source. A reticle stage mechanism 3 and wafer stage mechanism 10 synchronously scan the reticle 1 and a wafer (substrate) 9 while the reticle 1 is illuminated with the slit light. As a result of this synchronous scanning, the entire pattern of the reticle 1 is transferred onto the wafer 9 via a projection optical system 4.

The reticle stage mechanism 3 includes a reticle stage that holds the reticle 1 and a driving unit (for example, an actuator such as a linear motor), and is configured to drive the reticle stage by the driving unit on a surface plate 14. The wafer stage mechanism 10 includes a wafer stage that holds the wafer 9 and a driving unit (for example, an actuator such as a linear motor), and is configured to drive the wafer stage by the driving unit on a surface plate 15.

The two-dimensional positions of the reticle stage and wafer stage are measured in real time by measurement devices each including a reference mirror 11 and laser interferometer 12. Based on the measurement values, a stage controller 13 positions and synchronously controls the reticle 1 and wafer 9. In exposure, the wafer stage mechanism 10 can be controlled so that the focal plane of the projection optical system 4 is aligned with the surface of the wafer 9. Note that the surface position (the position in the vertical direction and the tilt) of the wafer 9 is measured by an optical focus sensor (not shown) and provided to the stage controller 13.

The main part of the device manufacturing apparatus can be placed in an environmental chamber (not shown), and the environment surrounding the main part can be maintained at a predetermined temperature. A given ambient temperature can be maintained with higher accuracy as air components whose temperatures are further individually controlled blow into the space surrounding, for example, the reticle stage mechanism 3, wafer stage mechanism 10, and laser interferometers 12 and that surrounding the projection optical system 4.

The wafer stage mechanism 10 and reticle stage mechanism 3 generate high heat by the driving units that respectively drive the wafer stage and reticle stage (controlled systems) upon processing the wafer 9 (object). Each driving unit drives the controlled system in accordance with a command from the stage controller 13, and the amount of heat generation of the driving unit depends on a driving pattern (control information to control the driving unit).

Heat generated by the driving units causes expansion and strain of the wafer stage (wafer 9) and reticle stage (reticle 1). The expansion and strain of the wafer stage and reticle stage may cause position fluctuations and tilts of the reference mirrors 11, thus generating errors in the measurement results obtained by the measurement devices each including the laser interferometer 12. Again, the expansion and strain of the wafer 9 and reticle 1 may cause distortion in a pattern formed on the wafer 9. When the temperatures of the wafer stage mechanism 10 and reticle stage mechanism 3 change, those of the air around them, in turn, change. If the air whose temperature has changed enters the optical paths of the laser interferometers 12, this causes measurement errors due to fluctuations associated with a change in refractive index. Hence, heat generated by the driving units must be quickly recovered.

To recover the heat generated by the driving unit (heat-generating portion) of the wafer stage mechanism 10 and keep its temperature constant, a cooling channel 5 is formed within the driving unit or in its periphery. A temperature-regulated coolant (a fluid such as a liquid or a gas) 30 is supplied into the cooling channel 5, which forms a circulation path for the coolant 30 together with a conduit 32 connected to it. A tank 29 is set in the circulation path and temporarily stores the coolant 30. The coolant 30 in the tank 29 is delivered to a heat exchanger (cooler) 24 via the conduit 32 by a pump 31.

A plate-type exchanger, for example, can be used as the heat exchanger 24. The plate-type exchanger supplies cooling water 27 and the coolant 30 as countercurrents using a plate as a partition to exchange heat between the cooling water 27 and the coolant 30. The coolant 30 having passed through the heat exchanger 24 has its temperature measured by a temperature sensor 22a set in the conduit 32, and the measurement value obtained by the temperature sensor 22a is provided to a first temperature control unit 21 of a temperature controller 20.

The first temperature control unit 21 regulates the degree of opening of a control valve 23 so that the measurement value obtained by the temperature sensor 22a becomes constant. With this operation, the flow rate of the cooling water 27 supplied to the heat exchanger 24 is regulated, and the temperature of the coolant 30, in turn, is regulated. The cooling water 27 is typically supplied from a plant facility (not shown) via a conduit 25. Note that the heat exchanger 24 is merely one example of a temperature regulator, and a temperature regulator which adopts a Peltier device or one including a refrigerator of the hot gas bypass type with a variable cooling capacity may be used instead.

The coolant 30 whose temperature is regulated so as to match a target temperature by the first temperature control unit 21 is supplied into the driving unit in the wafer stage mechanism 10 or to its periphery via the conduit 32. A heater 28 is inserted between the heat exchanger 24 and the driving unit, and the wafer stage mechanism 10 includes a temperature sensor 22b disposed, for example, around the driving unit. The temperature sensor 22b measures the temperature of the wafer stage mechanism 10 and the measurement value obtained by the temperature sensor 22b is provided to a second temperature control unit 26 of the temperature controller 20. The second temperature control unit 26 controls the heater 28 so that the measurement value obtained by the temperature sensor 22b becomes constant, thereby regulating the temperature of the coolant 30 that passes through the heater 28. The coolant 30 recovers heat generated by the driving unit (heat-generating portion) while circulating through the cooling channel 5 formed in the wafer stage mechanism 10, thereby keeping the temperature of the wafer stage mechanism 10 constant.

The driving unit in the wafer stage mechanism 10 is driven in accordance with a drive command corresponding to a driving pattern, which is provided from the stage controller 13. The amount of heat generation of the driving unit may change depending on the driving pattern. The driving pattern means a target value (for example, a target position) to control the controlled system, and represents a temporal change in target state or command value.

In the conventional temperature control method, a target temperature, determined to enable temperature control of the driving unit even in a driving pattern that generates a maximum amount of heat, is set invariable. In this respect, the coolant 30 is cooled by the heat exchanger 24 in accordance with the invariable target temperature irrespective of the amount of heat generation. Therefore, in the conventional temperature control method, the coolant 30 regulated to a relatively low temperature assuming a maximum amount of heat generation is supplied to the heater 28 and is always heated by the heater 28 even when the amount of heat generation is small. As a result, power is excessively consumed especially when the operating ratio of the device manufacturing apparatus is low and when the device manufacturing apparatus operates in accordance with a driving pattern which generates a small amount of heat.

Under the circumstance, in the embodiment of the present invention, the stage controller 13 changes the target temperature for control by the first temperature control unit 21 in accordance with a driving pattern (control information) to control the driving unit in the wafer stage mechanism 10. More specifically, the stage controller 13 sets a target temperature in accordance with the amount of heat generation of the driving unit in the wafer stage mechanism 10. For example, the target temperature is set lower with increasing amount of heat generation of the wafer stage mechanism 10. Also, the target temperature is set higher with decreasing amount of heat generation of the driving unit in the wafer stage mechanism 10. This makes it possible to reduce power wastefully consumed by the heater 28 of the second temperature control unit 26.

A main controller (not shown), which controls the overall operation of the device manufacturing apparatus, may be inserted between the stage controller 13 and the temperature controller 20, as a matter of course. Alternatively, the main controller may send a driving pattern to the stage controller 13 and instruct the temperature controller 20 to set a target temperature corresponding to the sent driving pattern.

Although the cooling channel 5 for supplying the coolant 30 is formed in only the wafer stage mechanism 10 in the device manufacturing apparatus illustrated in FIG. 1, a similar cooling channel can also be formed in the reticle stage mechanism 3.

FIGS. 2A to 2D are charts for explaining, as a comparative example, a method of setting an invariable (constant) target temperature that tolerates a maximum amount of heat generation as the target temperature of the first temperature control unit 21. FIGS. 2E to 2H are charts for explaining, as the embodiment of the present invention, a method of setting a target temperature corresponding to the amount of heat generation as the target temperature of the first temperature control unit 21 by the stage controller 13.

Figure 2A:
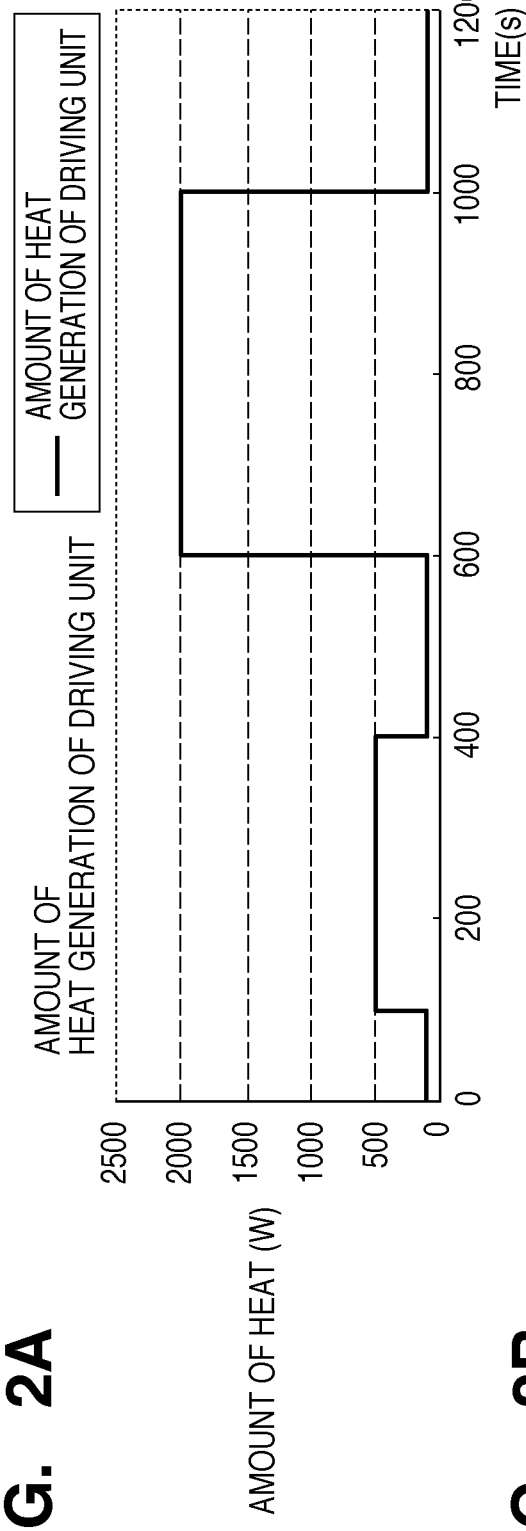
FIG. 2A is a chart for explaining a method of setting an invariable (constant) target temperature which tolerates a maximum amount of heat generation as the target temperature of a first temperature control unit.

FIGS. 2A and 2E illustrate the amounts of heat generation of the driving unit in the wafer stage mechanism 10. The ordinate indicates the amount of heat generation (W), and the abscissa indicates time (s). A minimum amount of heat generation indicates a standby state. In the duration of Time= 100 (s) to 400 (s), the wafer stage is driven at a low acceleration in accordance with a given driving pattern and therefore the amount of heat generation is small. In the duration of Time=600 (s) to 1000 (s), the wafer stage is driven at a high acceleration in accordance with the driving pattern and therefore the amount of heat generation is large. The amount of heat generation is maximum when the wafer stage is driven at a maximum acceleration in accordance with the driving pattern.

Figure 2B:
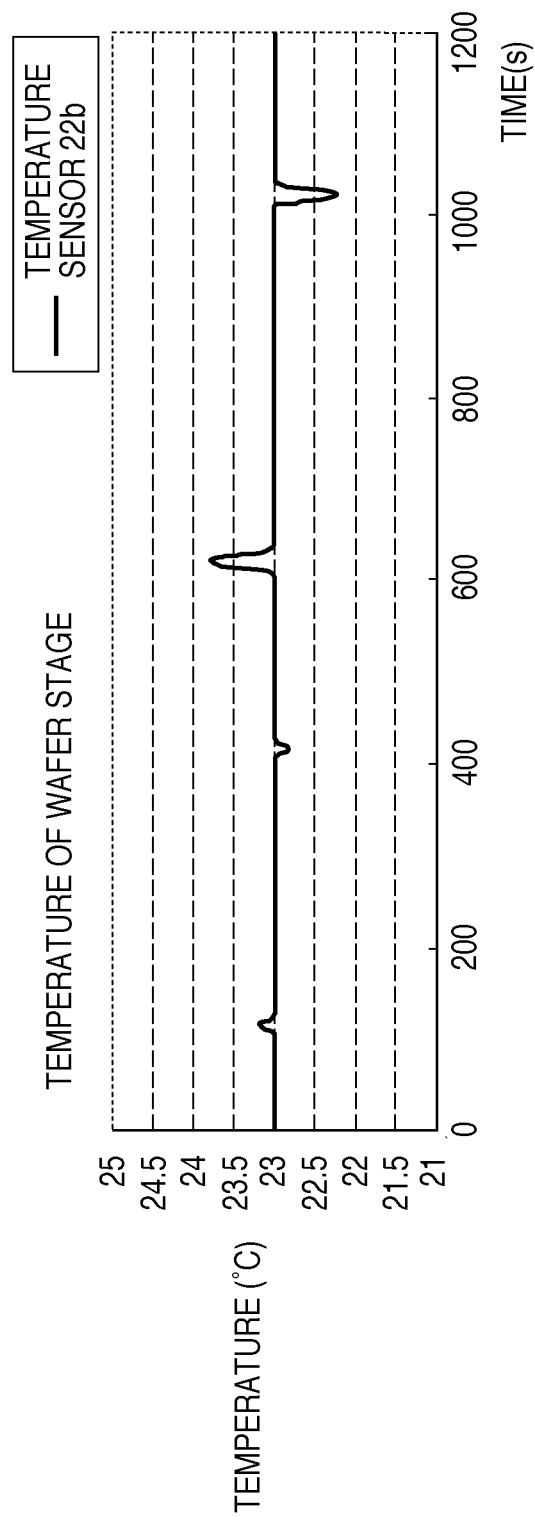
FIG. 2B is a chart for explaining the method of setting an invariable (constant) target temperature which tolerates a maximum amount of heat generation as the target temperature of the first temperature control unit.

FIGS. 2B and 2F illustrate the measurement values obtained by the temperature sensor 22b. As can be seen from FIGS. 2B and 2F, a temperature fluctuation occurs at a point of change in amount of heat generation of the driving unit.

Figure 2C:
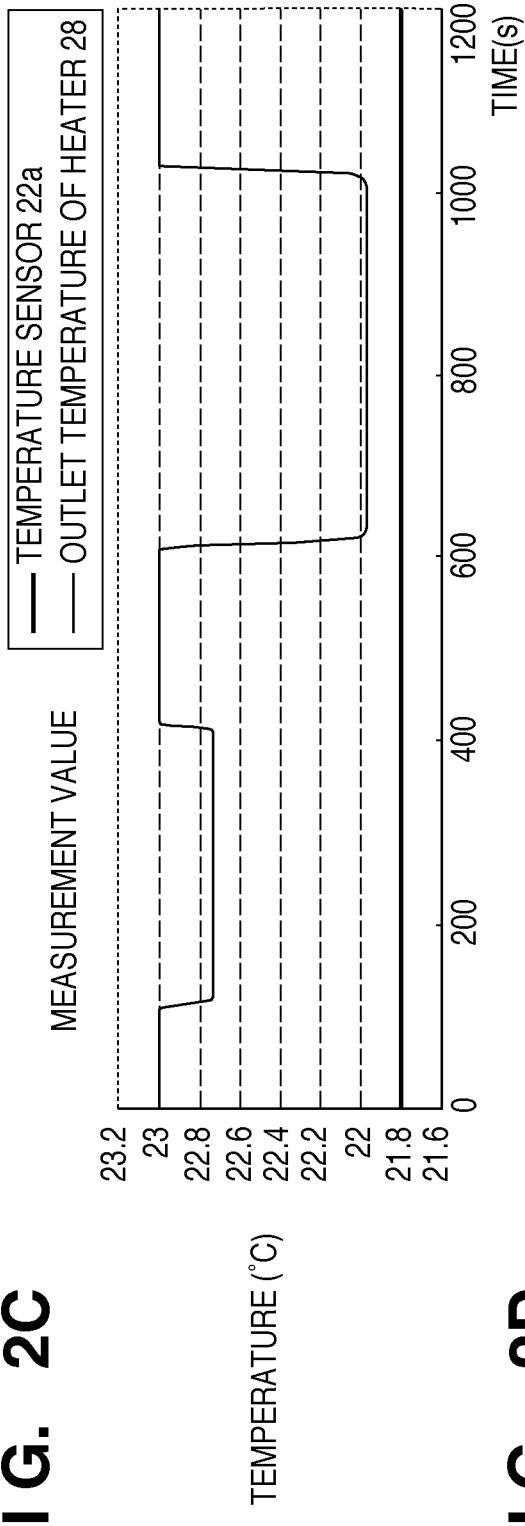
FIG. 2C is a chart for explaining the method of setting an invariable (constant) target temperature which tolerates a maximum amount of heat generation as the target temperature of the first temperature control unit.

FIG. 2C illustrates a change in temperature of the coolant 30 in the comparative example. The target temperature for control by the first temperature control unit 21 was set to 21.8° C. The outlet temperature of the heater 28 controlled by the second temperature control unit 26 can be kept higher than the target temperature for control by the first temperature control unit 21 even when the driving unit generates a maximum amount of heat. This makes it possible to control the temperature of the driving unit in the wafer stage mechanism 10 without saturating the manipulated variable output from the second temperature control unit 26 to the heater 28 at a lower limit.

Figure 2D:
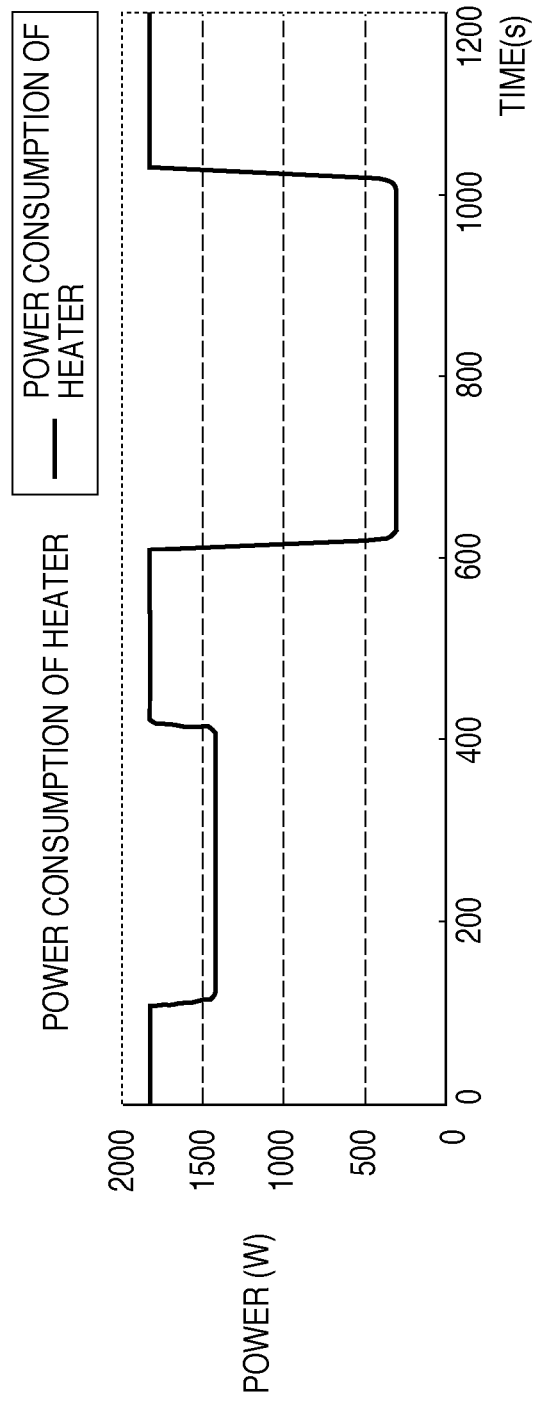
FIG. 2D is a chart for explaining the method of setting an invariable (constant) target temperature which tolerates a maximum amount of heat generation as the target temperature of the first temperature control unit.

FIG. 2D illustrates the power consumption of the heater 28. The power consumption of the heater 28 is maximum when the wafer stage mechanism 10 is standing by, whereas it is minimum when the amount of heat generation of the driving unit in the wafer stage mechanism 10 is maximum.

Figure 2G:
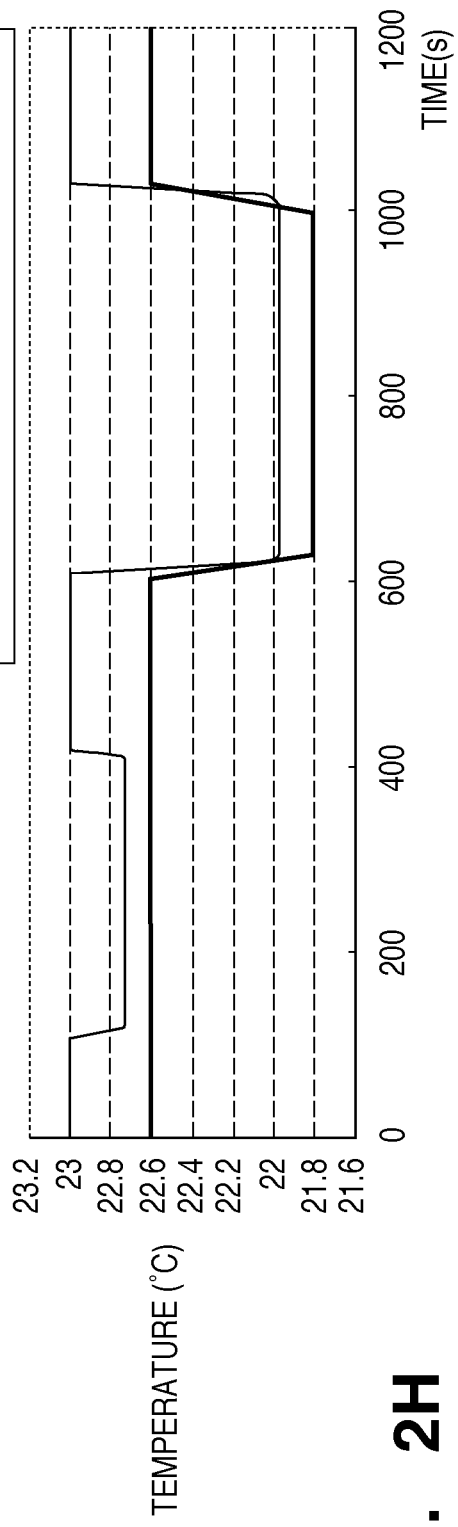
FIG. 2G is a chart for explaining the method of setting a target temperature corresponding to the amount of heat generation as the target temperature of the first temperature control unit.

FIG. 2G illustrates the temperature (the measurement value obtained by the temperature sensor 22a) of the coolant 30 whose temperature is controlled by the first temperature control unit 21 and that of the coolant 30 having passed through the heater 28 manipulated by the second temperature control unit 26 in the embodiment of the present invention. The target temperature for control by the first temperature control unit 21 in a steady state is set higher than that in the comparative example. In case of a driving pattern, which generates a small amount of heat, the temperature of the coolant 30 can be controlled without saturating the manipulated variable for the heater 28 manipulated by the second temperature control unit 26 at a lower limit even when the target temperature for control by the first temperature control unit 21 is set high. In contrast, in case of a driving pattern that generates a large amount of heat, the target temperature for control by the first temperature control unit 21 is set low. This makes it possible to prevent the manipulated variable for the heater 28 manipulated by the second temperature control unit 26 from saturating at a lower limit.

Figure 2H:
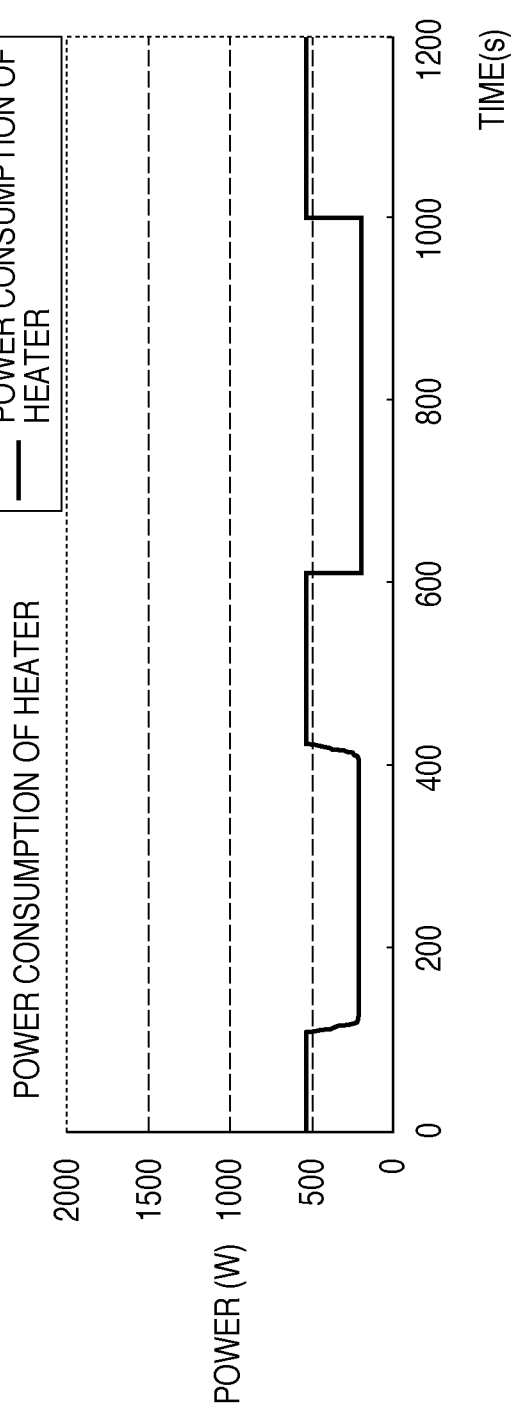
FIG. 2H is a chart for explaining the method of setting a target temperature corresponding to the amount of heat generation as the target temperature of the first temperature control unit.

FIG. 2H illustrates the power consumption of the heater 28 in the embodiment of the present invention. As can be seen from FIG. 2H, temperature control equivalent to the comparative example is possible while suppressing power consumption during a standby time when the power consumption is relatively large.

Figure 3:
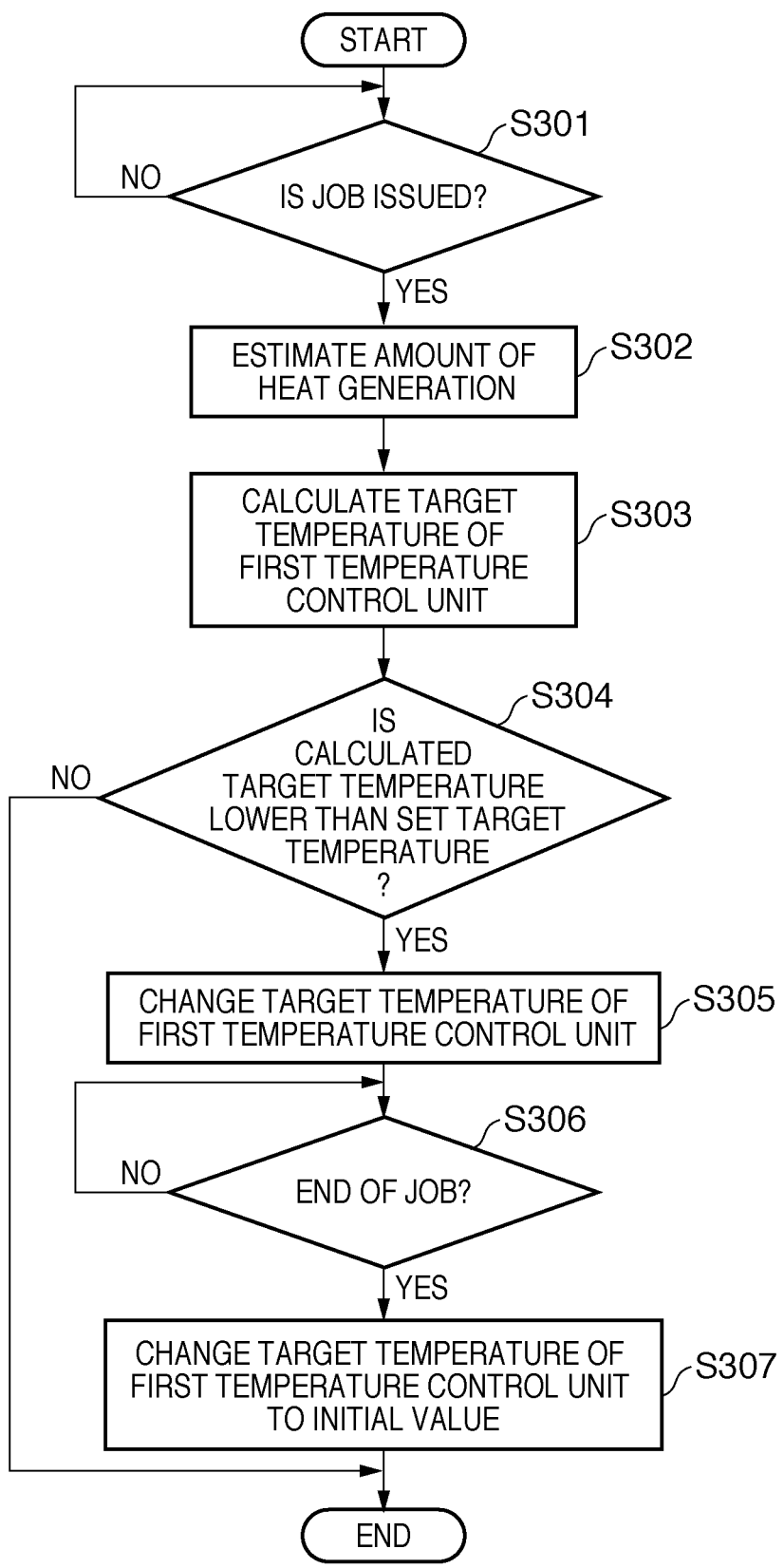
FIG. 3 is a flowchart showing an embodiment of the present invention.

FIG. 3 is a flowchart illustrating one example of processing by the stage controller 13. Note that this processing may be performed by, for example, the main controller which controls the first temperature control unit 21 and stage controller 13, as described above.

When a job for operating the driving unit in the wafer stage mechanism 10 is issued ("YES" in S301), the stage controller 13 estimates the amount of heat generation of the driving unit based on the acceleration and velocity of the stage, the shot size, and the number of shots (S302). Next, the stage controller 13 calculates a target temperature of the first temperature control unit 21 based on the obtained estimation result (S303). If the calculated target temperature is lower than the set target temperature ("YES" in S304), the stage controller 13 changes the target temperature of the first temperature control unit 21 to the calculated target temperature (S305). After the job is completed ("YES" in S306), the stage controller 13 changes the target temperature to an initial value (S307).

Figure 4A:
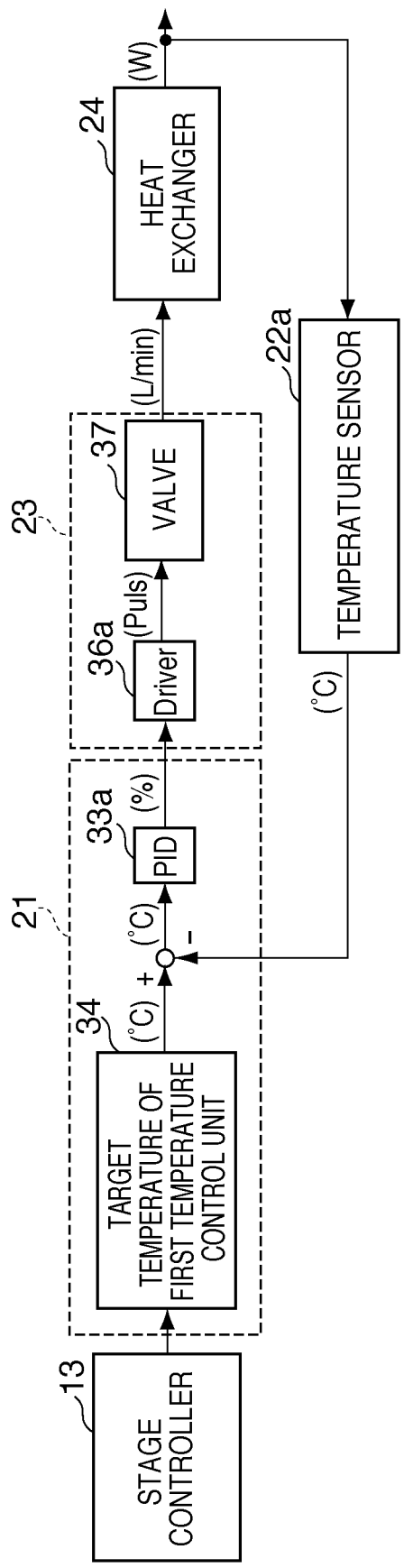
FIG. 4A is a block diagram showing a primary temperature-regulating system including the first temperature control unit.

FIG. 4A is a block diagram showing a primary temperature-regulating system including the first temperature control unit 21. The stage controller 13 sets a target temperature for the first temperature control unit 21. The first temperature control unit 21 stores a target temperature in a memory 34, calculates, as needed, a deviation between the target temperature and the temperature measurement value obtained by the temperature sensor 22a, and sends the calculation result to a PID compensator 33a. The PID compensator 33a calculates a manipulated variable based on the deviation, and sends the calculation result to the control valve 23. The control valve 23 controls the degree of opening of a valve 37 via a driver 36a.

The flow rate of the cooling water 27 which flows into the heat exchanger 24 changes in response to a change in degree of opening of the valve 37. The heat exchanger 24 performs heat exchange between the coolant 30 and the cooling water 27. The temperature of the coolant 30 having passed through the heat exchanger 24 is measured by the temperature sensor 22a, and the measurement value is fed back to the first temperature control unit 21.

Figure 4B:
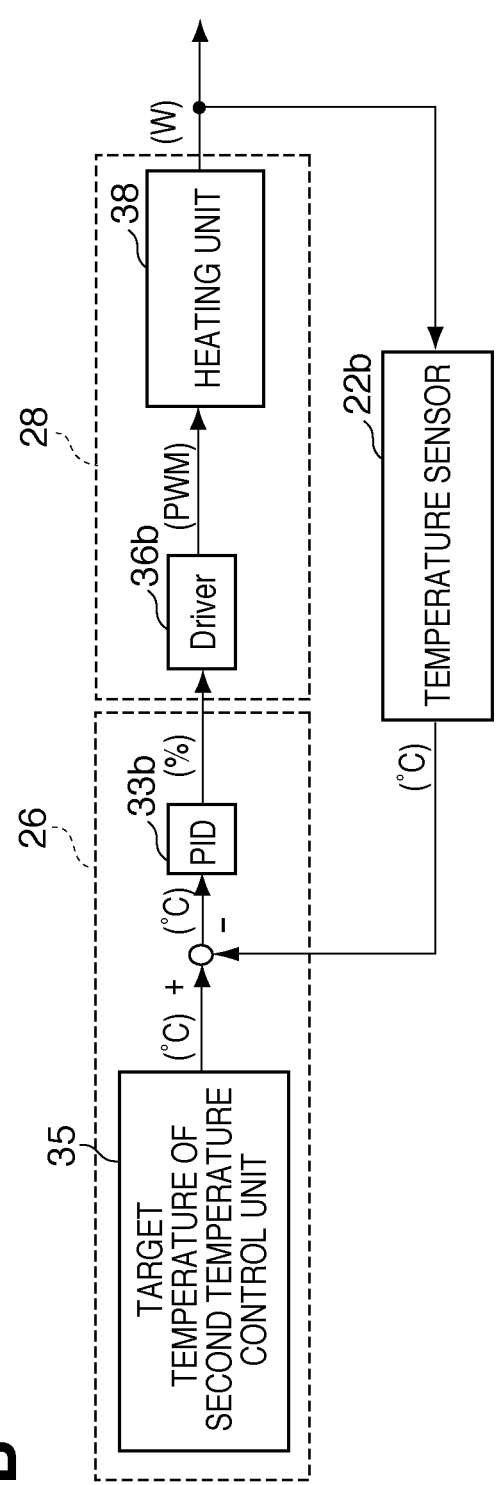
FIG. 4B is a block diagram showing a secondary temperature-regulating system including a second temperature control unit.

FIG. 4B is a block diagram showing a secondary temperature-regulating system including the second temperature control unit 26. The secondary temperature-regulating system is a feedback control system independent of the primary temperature-regulating system. The second temperature control unit 26 stores a target temperature in a memory 35, calculates, as needed, a deviation between the target temperature and the temperature measurement value obtained by the temperature sensor 22b, and sends the calculation result to a PID compensator 33b. The PID compensator 33b calculates a manipulated variable based on the deviation, and sends the calculation result to a PWM conversion driver 36b. The PWM conversion driver 36b drives a heating unit 38 in accordance with the manipulated variable to generate heat, thereby heating the coolant 30. The heated coolant 30 flows through the cooling channel 5 in the wafer stage mechanism 10 to cool the driving unit in the wafer stage mechanism 10. The temperature of the wafer stage mechanism 10 is measured by the temperature sensor 22b, and the measurement value is sent to the second temperature control unit 26.

Figure 5:
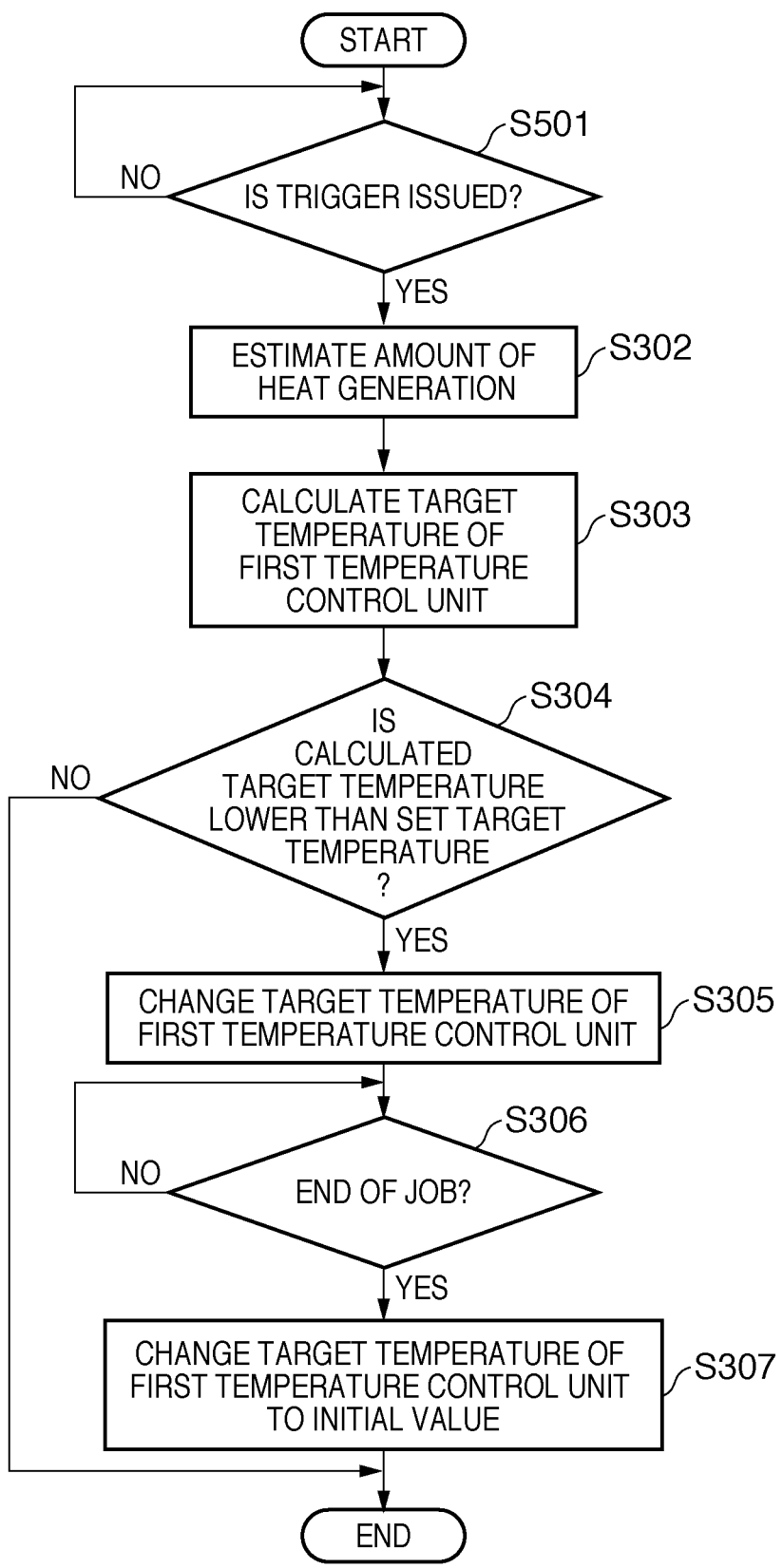
FIG. 5 is a flowchart showing another embodiment of the present invention.

FIG. 5 is a block diagram showing a modification of the processing shown in FIG. 3. In this modification, the target temperature for control by the first temperature control unit 21 is changed in advance using a trigger (S501) when the amount of heat generation of the driving unit in the wafer stage mechanism 10 (and/or the reticle stage mechanism 3) is still small. This modification assumes a case in which the distance from the heat exchanger 24 in the primary temperature-regulating system including the first temperature control unit 21 to the heater 28 in the secondary temperature-regulating system including the second temperature control unit 26 is long, so a delay occurs in temperature control by the secondary temperature-regulating system. This modification is useful when the secondary temperature-regulating system including the second temperature control unit cannot appropriately regulate the temperature when the target temperature for control by the first temperature control unit is changed simultaneously with an increase in amount of heat generation of the driving unit. The trigger used may be, for example, an operation of loading a first wafer 9, detection of a mark on a first wafer 9, or a command to measure a mark embedded in the wafer stage of the wafer stage mechanism 10.

Figure 6:
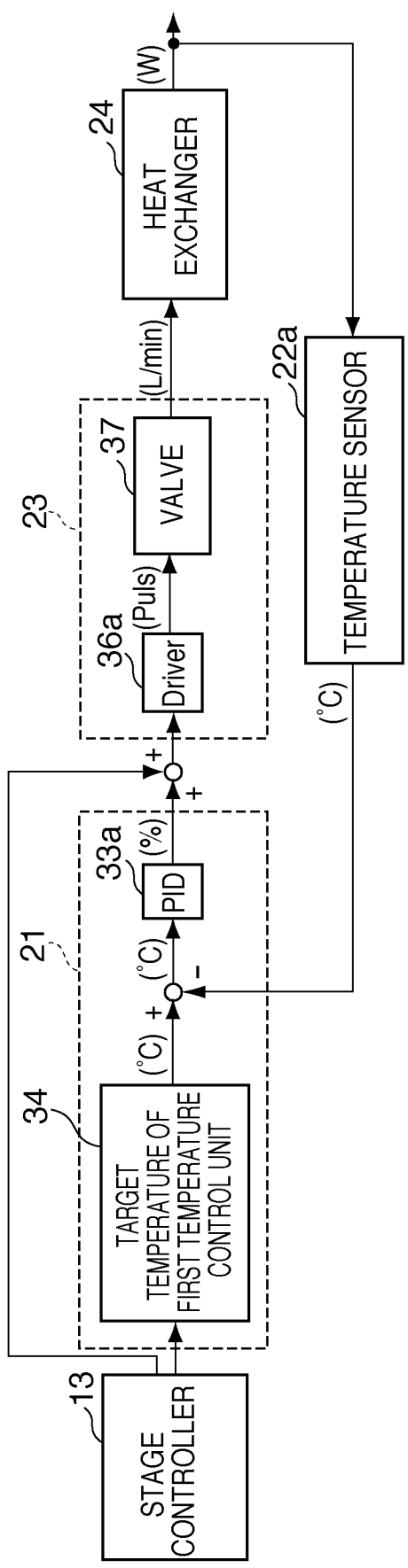
FIG. 6 is a block diagram showing the configuration of a primary temperature-regulating system in the device manufacturing apparatus according to another embodiment of the present invention.

FIG. 6 shows a primary temperature-regulating system obtained by additionally providing the one shown in FIG. 4A with an adder AD which adds an offset to the manipulated variable of the first temperature control unit 21 simultaneously with a change in target temperature for control by the first temperature control unit 21. The primary temperature-regulating system shown in FIG. 6 is useful in applying the present invention to a control system, which can hardly set a high proportional gain (P) for the PID compensator 33a due to the long amount of wasted time. The deviation increases in response to a change in target temperature for control by the first temperature control unit 21, so the manipulated variable output from the PID compensator 33a decreases at a rate determined by the proportional gain (P). However, in a control system which stabilizes only when the proportional gain (P) is set low, the rate of decrease in manipulated variable is small, resulting in a long time for convergence to the target temperature. Hence, an offset is preferably added by the adder AD to the manipulated variable output from the PID compensator 33a almost simultaneously with a change in target temperature to improve the control characteristic. The offset value of the manipulated variable can be either positive or negative.

Figure 7:
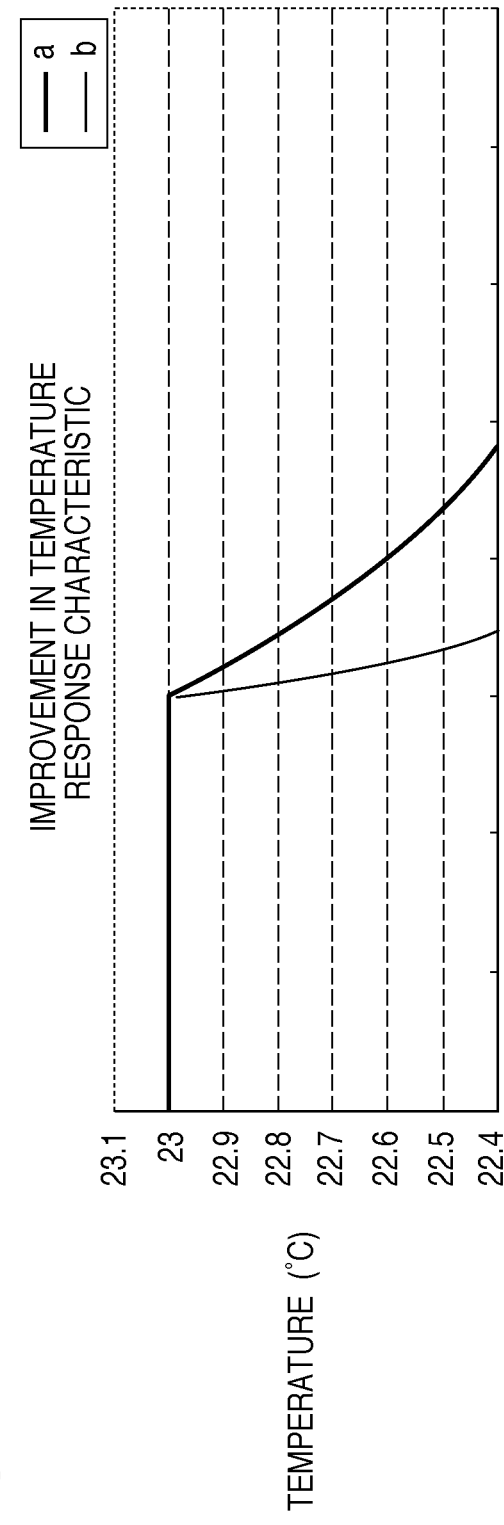
FIG. 7 is a chart for explaining an exemplary temperature transition in the embodiment shown in FIG. 6.

FIG. 7 is a chart exemplifying the temperature response characteristics when an offset is added to the manipulated variable (line b) and when no offset is added to the manipulated variable (line a). The line b indicating a case in which an offset is added to the manipulated variable can have a temperature increase rate larger than that of the line a.

Figure 8:
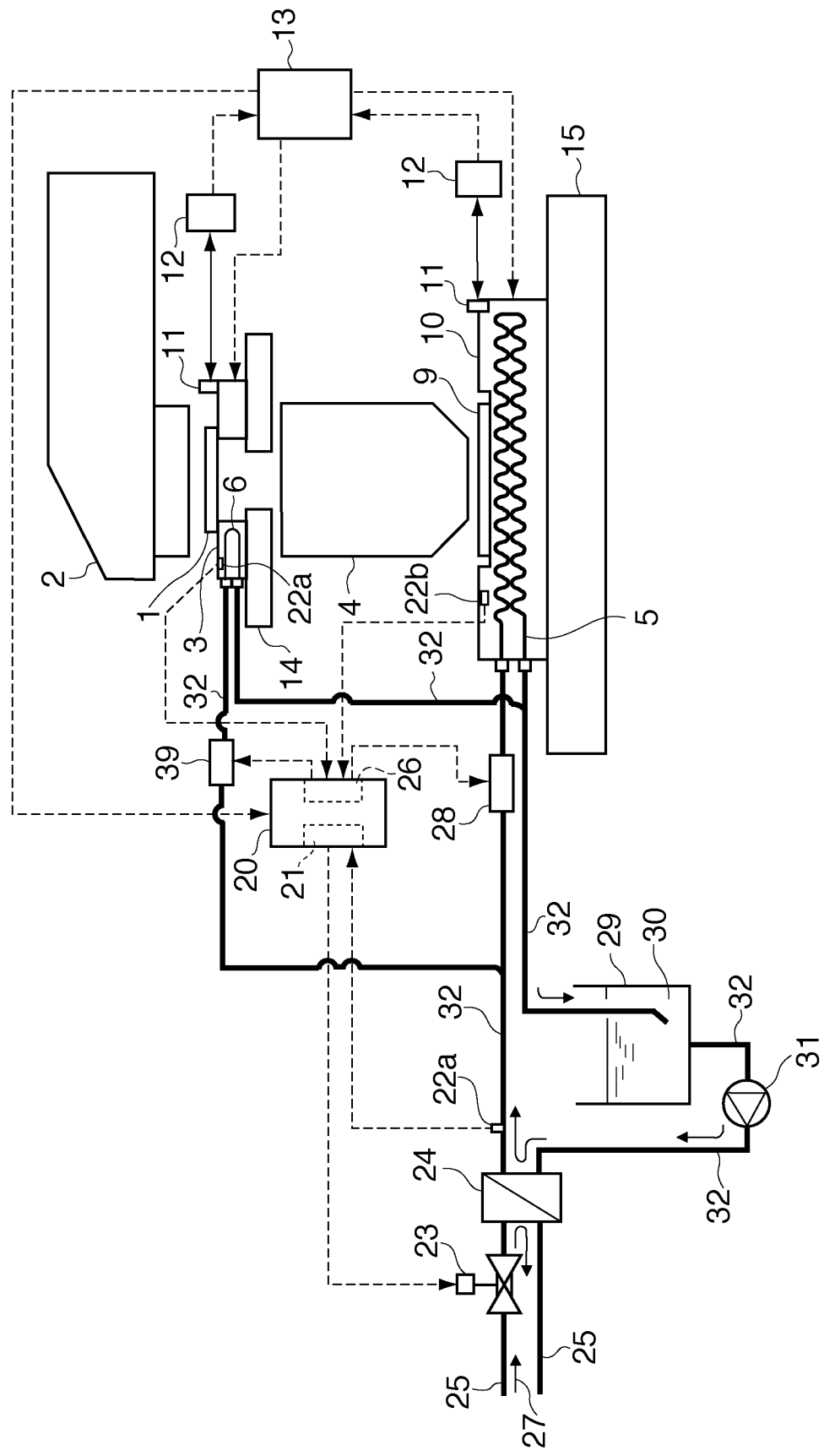
FIG. 8 is a view showing the schematic arrangement of a device manufacturing apparatus according to another embodiment of the present invention.

FIG. 8 is a view schematically showing the arrangement of a device manufacturing apparatus according to another embodiment of the present invention. The apparatus in the embodiment shown in FIG. 8 includes two secondary temperature-regulating systems including a second temperature control unit 26 for one primary temperature-regulating system including a first temperature control unit 21. The difference from FIG. 1 resides in that a reticle stage mechanism 3 includes a cooling channel 6. The reticle stage mechanism 3 includes a temperature sensor 22c and the temperature measurement value obtained by the temperature sensor 22c is sent to the second temperature control unit 26. The second temperature control unit 26 manipulates a heater 39, which heats a coolant 30 supplied to the cooling channel 6, in accordance with the temperature measurement value obtained by the temperature sensor 22c to regulate the temperature of the coolant 30. Although two secondary temperature-regulating systems are shown in this example, more than two secondary temperature-regulating systems may be used. Also, targets to be temperature-regulated by the secondary temperature-regulating systems can include even surface plates 14 and 15 and a projection optical system 4, whose temperature changes are relatively small.

Figure 9:
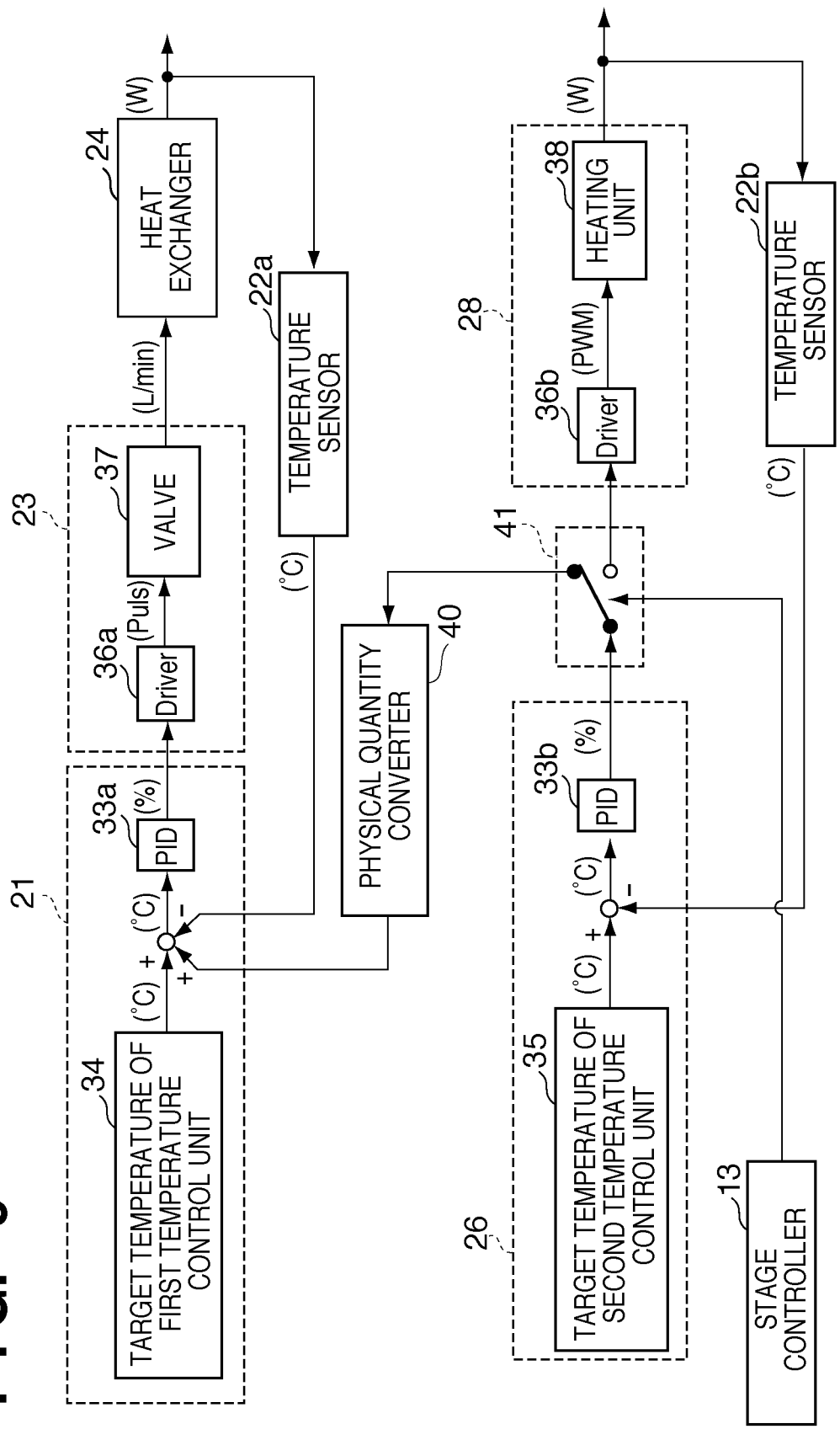
FIG. 9 is a block diagram showing the configuration of a temperature-regulating system in the device manufacturing apparatus according to another embodiment of the present invention.

FIG. 9 is a block diagram showing a temperature controller 20 according to another embodiment of the present invention. The temperature controller 20 can be applied to, for example, the device manufacturing apparatus shown in FIG. 1. In the embodiments shown in FIGS. 4A and 4B, the primary temperature-regulating system and the secondary temperature-regulating system are independent of each other.

A switch 41 is additionally inserted between a PID compensator 33b and a PWM conversion driver 36b in a second temperature control unit 26. The temperature controller 20 shown in FIG. 9 includes a first mode and second mode as operation modes. The operation mode can be determined by a controller such as a stage controller 13 in accordance with a driving profile (control information to control a driving unit).

In the first mode, heating by a heater 28 is stopped while cooling by a heat exchanger 24 is controlled based on a deviation between the temperature measured by a temperature sensor 22b and a target temperature stored in a memory 35. In the second mode, cooling by the heat exchanger 24 is controlled based on a deviation between the temperature measured by a temperature sensor 22a and a first target temperature stored in a memory 34. Also in the second mode, in parallel with the foregoing control, heating by the heater 28 is controlled based on a deviation between the temperature measured by the temperature sensor 22b and a second target temperature stored in the memory 35.

The switch 41 has its output-side normal open line connected to a driver 36, and its normal close line connected to a physical quantity converter 40. The physical quantity converter 40 converts the output value (%) from the PID compensator 33b of the second temperature control unit 26 into a temperature (° C.). The output of the physical quantity converter 40 is connected to an adder-subtractor in the first temperature control unit 21. The switch 41 can be switched under the control of the stage controller 13.

When a wafer stage mechanism 10 is standing by, the first mode is selected as the operation mode. In the first mode, the stage controller 13 sets the switch 41 to an OFF state (the state in which the output of the PID compensator 33b is connected to the physical quantity converter 40). In this case, cascade control in which the second temperature control unit 26 functions as a major loop while a first temperature control unit 21 functions as a minor loop is implemented. Hence, the first temperature control unit 21 operates so that the temperature information measured by the temperature sensor 22b settles to the target temperature of the second temperature control unit 26. At this time, because the heater 28 of the secondary temperature-regulating system is not driven, no power consumption is incurred. This makes it possible to reduce power consumption during standby.

When the wafer stage mechanism 10 activates, the second mode is selected as the operation mode. In the second mode, the stage controller 13 sets the switch 41 to an ON state (the state in which the output of the PID compensator 33b is connected to the PWM conversion driver 36b). In this case, the output from the physical quantity converter 40, which has been input to the adder-subtractor of the first temperature control unit 21, becomes zero, so the first temperature control unit 21 functions as an independent temperature control system. Also, the manipulated variable of the second temperature control unit 26 is connected to the heater 28 and functions as an independent temperature control system as well. This realizes the same temperature control as in FIGS. 4A and 4B, when the driving unit is active, by reducing power consumption of the heater 28 during standby when the productivity is low.

Figure 10:
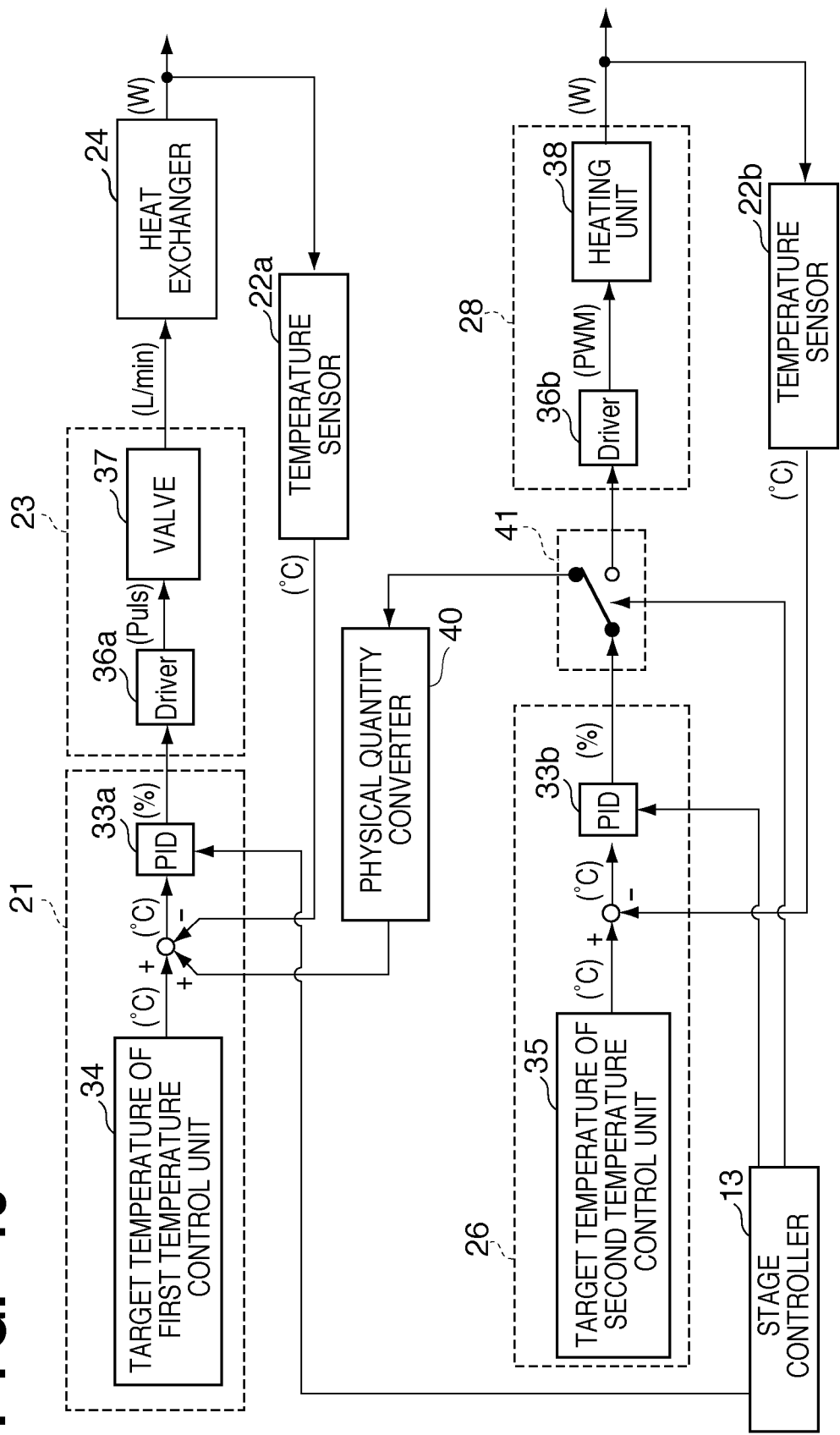
FIG. 10 is a block diagram showing the configuration of a temperature-regulating system in the device manufacturing apparatus according to still another embodiment of the present invention.

FIG. 10 shows an embodiment practiced by adding a function of controlling PID compensators 33a and 33b by a stage controller 13 to the embodiment shown in FIG. 9. The stage controller 13 switches the temperature control method (operation mode) by turning on/off a switch 41, and an optimum PID differs depending on the temperature control method. For this reason, the parameters of the PID compensators 33a and 33b are changed simultaneously with the switching of the switch 41. The parameters of the PID compensators 33a and 33b are changed by the stage controller 13. Alternatively, the parameters may be changed using parameters preset in a temperature controller 20 in synchronism with the switch 41.

Figure 11:
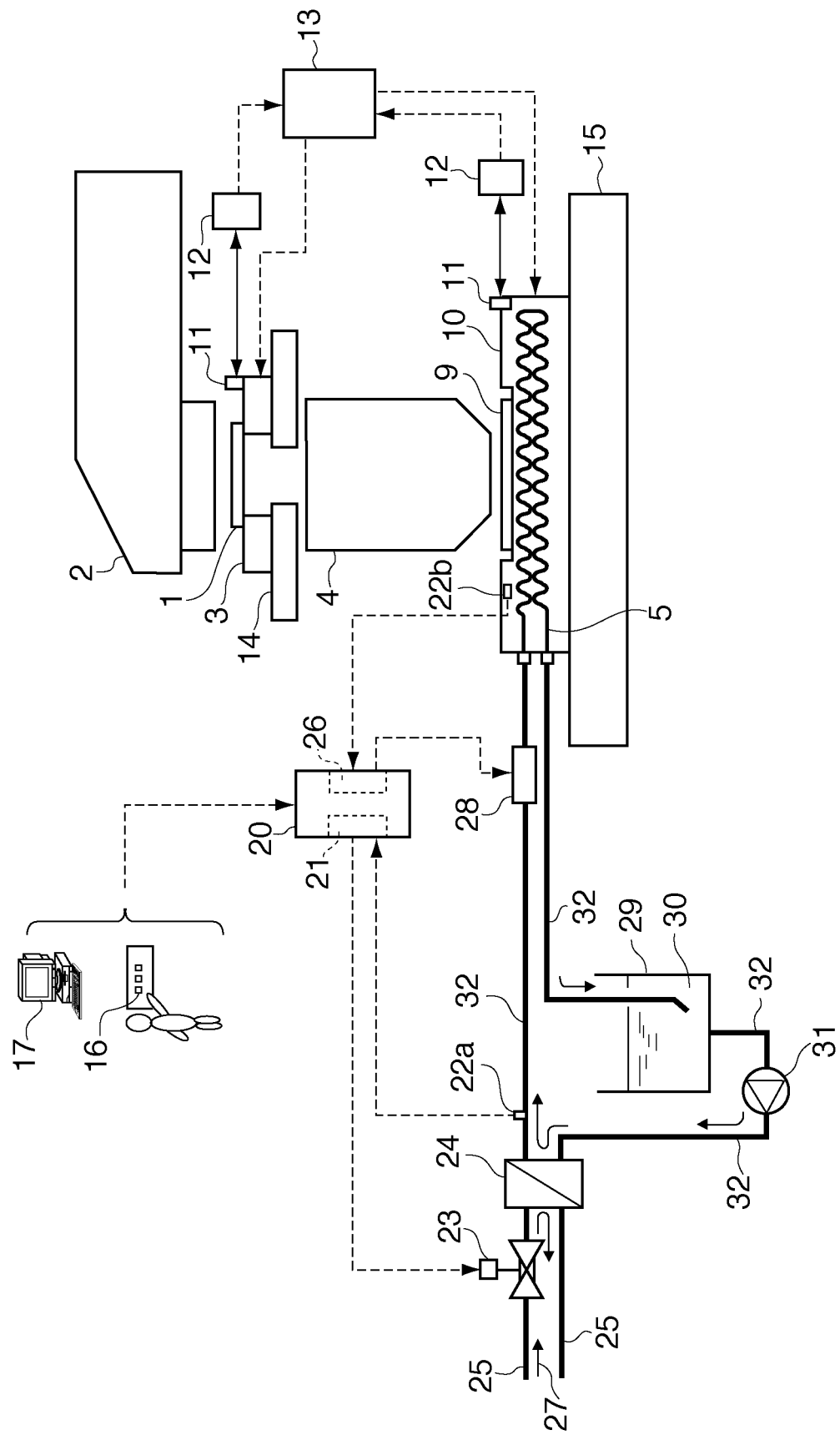
FIG. 11 is a view showing the schematic arrangement of a device manufacturing apparatus according to still another embodiment of the present invention.

FIG. 11 is a view schematically showing the arrangement of a device manufacturing apparatus according to still another embodiment of the present invention. The difference from FIG. 1 resides in that the target temperature for control by a temperature controller 20 is set in accordance with a command from a console 16 included in the device manufacturing apparatus and/or a remote console 17 which can access the device manufacturing apparatus from a remote site. The console 16 and remote console 17 can include, for example, touch panels and/or switches.

Figure 12:
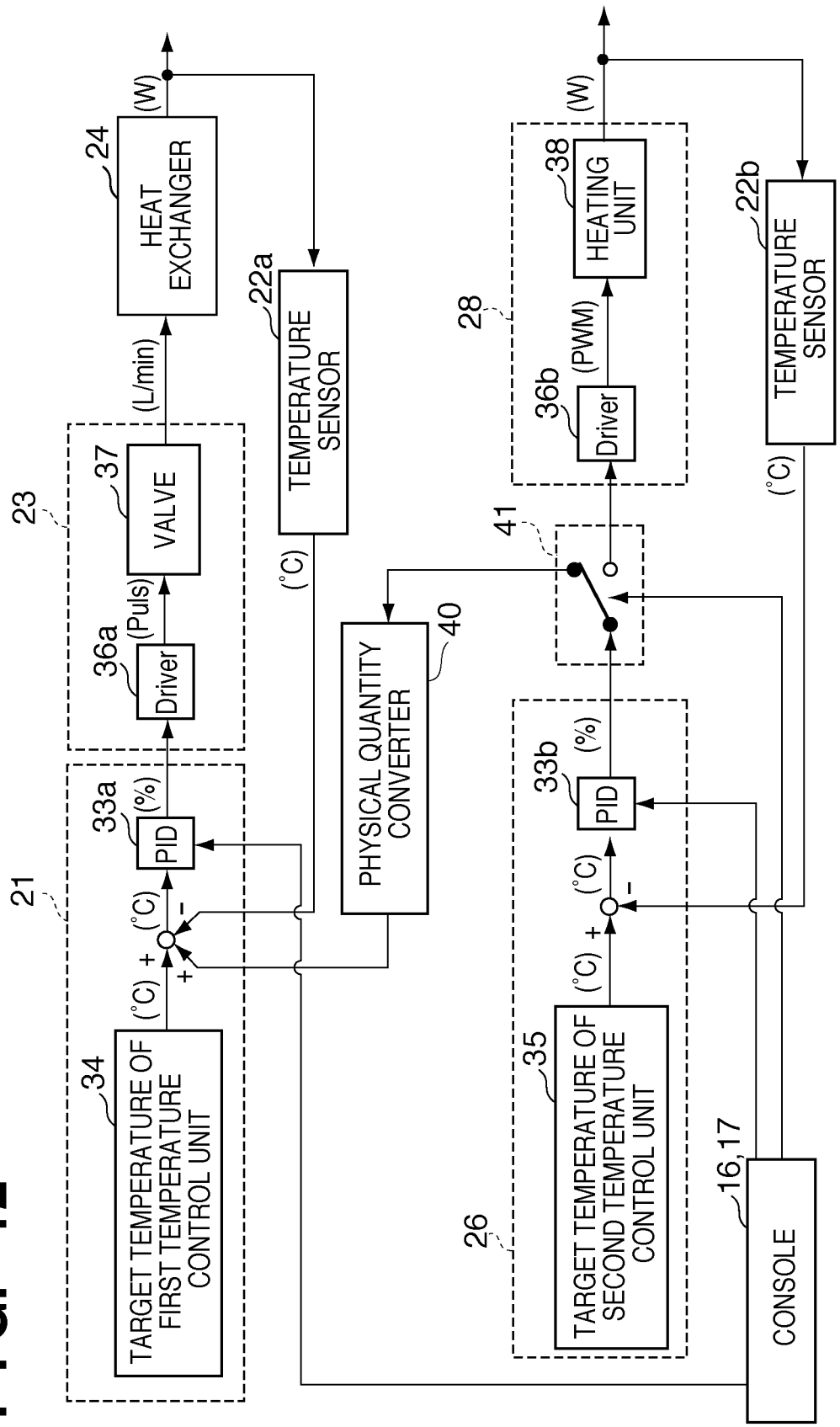
FIG. 12 is a block diagram showing the configuration of a temperature-regulating system in the device manufacturing apparatus according to still another embodiment of the present invention.

FIG. 12 shows a temperature-regulating system obtained by providing the one shown in FIG. 9 with the console 16 and/or 17, in place of the stage controller 13. In this embodiment, cascade control and independent temperature control methods can be selected by manipulating the console 16 and/or 17.

The embodiments shown in FIGS. 11 and 12 are useful when no devices are manufactured over several hours to several days, such as during maintenance of the device manufacturing apparatus. When the device manufacturing apparatus stops temperature control, its temperature becomes equal to that of a clean room. Several hours to 48 hrs are required for temperature stabilization time until the apparatus becomes ready for exposure again from this state. For this reason, a function of keeping the temperature constant while conserving energy is effective. This embodiment is also useful from the viewpoint of reducing the burden of software development by separating the temperature control system from the stage controller 13. It is more preferable to switch the parameters of, for example, the PID compensators 33a and 33b depending on the control scheme adopted. The parameters can include, for example, thresholds for tolerance determination.

Figure 13:
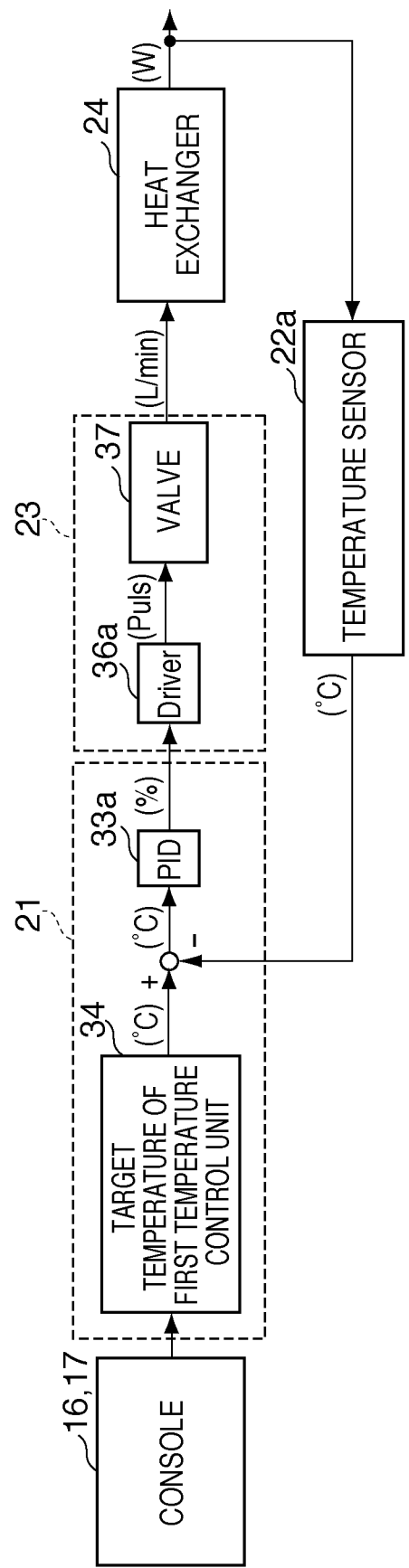
FIG. 13 is a block diagram showing the configuration of a temperature-regulating system in the device manufacturing apparatus according to still another embodiment of the present invention.

FIG. 13 is a block diagram schematically showing the configuration of a temperature-regulating system according to still another embodiment of the present invention. In this embodiment, the target temperature for control by a first temperature control unit 21 is changed in accordance with a signal from a console 16 and/or 17. The target temperature can be changed using a parameter preset in a temperature controller 20. The target temperature is not limited to a parameter preset in the temperature controller 20, and may be acquired from the console 16 or 17, a stage controller 13, or a controller (not shown) in accordance with a signal from the console 16 and/or 17.

A timer function, for example, may be additionally provided to the console 16 and/or 17 to change the target temperature of the first temperature control unit 21 in accordance with a timing designated by the timer function. When, for example, the device manufacturing apparatus is set in a standby state during the nighttime, it is also effective to operate the apparatus while conserving energy from 10 p.m. to 5 a.m. and automatically return it to a high-accuracy temperature environment during the daytime in which the user uses it.

Figure 14:
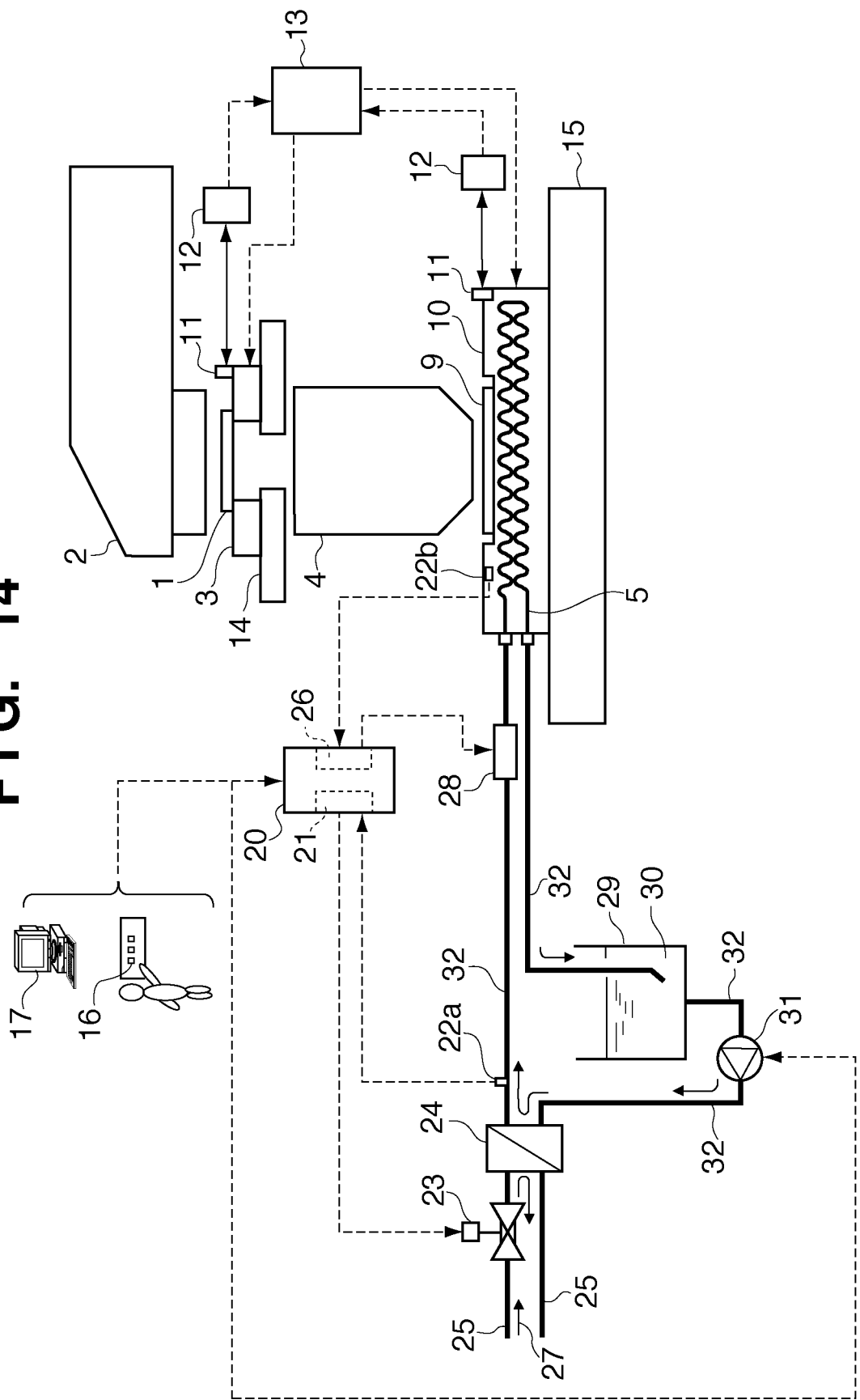
FIG. 14 is a view showing the schematic arrangement of a device manufacturing apparatus according to still another embodiment of the present invention.

FIG. 14 is a view schematically showing the arrangement of a device manufacturing apparatus according to still another embodiment of the present invention. The difference from FIG. 11 resides in that a function of changing the operating frequency of a pump 31 in accordance with a signal from a console 16 and/or 17 is added. The pump 31 is preferably operated by an inverter (flow controller). When the apparatus enters an energy conservation state, the flow rate of a coolant 30 discharged from the pump 31 is preferably decreased by lowering the frequency of the inverter. Keeping the flow rate of the coolant 30 low makes it possible to decrease both the consumption flow rate of cooling water 27 required for a heat exchanger 24 and the power consumption of a heater 28 of a second temperature control unit 26. At this time, since the temperature control characteristic largely changes, the parameters of PID compensators 33a and 33b and tolerance determination parameters, for example, are desirably changed at the same time.

The device manufacturing apparatus is not limited to an exposure apparatus, and can be all types of apparatuses including a heat-generating portion (for example, a deposition apparatus, an etching apparatus, an inspection apparatus, and an operation apparatus).

A method of manufacturing a device according to an embodiment of the present invention can be applied to the manufacture of devices such as a semiconductor device and a liquid crystal device. The method can include a step of exposing a substrate coated with a photosensitive agent using a device manufacturing apparatus configured as an exposure apparatus, and a step of developing the exposed substrate. The method of manufacturing a device can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-105607, filed Apr. 23, 2009, which is hereby incorporated by reference herein in its entirety.

What is claimed is:

1. A device manufacturing apparatus which includes a driving unit configured to perform driving for processing an object, a conduit through which a coolant that recovers heat generated by the driving unit flows, a cooler configured to cool the coolant that flows through the conduit, and a heater configured to heat the coolant cooled by the cooler so that the driving unit cooled by the heated coolant has a unit target temperature as a target temperature of the driving unit, the apparatus comprising:
a controller configured to heighten a cooler target temperature as a target temperature of the coolant downstream of the cooler and upstream of the heater, if it is determined, based on control information to control the driving unit, that a heat amount to be generated by the driving unit decreases.

2. An apparatus according to claim 1, wherein the controller is configured to estimate the heat amount based on the control information and to set the cooler target temperature in accordance with the estimated heat amount.

3. An apparatus according to claim 1, further comprising:
a temperature controller including a PID compensator configured to output a signal to control cooling by the cooler in accordance with a deviation between the cooler target temperature and a temperature of the coolant downstream of the cooler and upstream of the heater; and
an adder configured to add an offset to the signal output from the PID compensator based on the control information.

4. An apparatus according to claim 1, wherein the apparatus has, as an operation mode thereof,
a first mode in which heating by the heater is stopped, and cooling by the cooler is controlled based on a deviation between a first cooler target temperature and a temperature of the driving unit, and
a second mode in which cooling by the cooler is controlled based on a deviation between a second cooler target temperature and a temperature of the coolant downstream of the cooler and upstream of the heater, and heating by the heater is controlled based on a deviation between the unit target temperature and a temperature of the driving unit,
wherein the first cooler target temperature is higher than the second cooler target temperature.

5. An apparatus according to claim 4, wherein the controller is configured to select one of the first and second operation modes based on the control information.

6. An apparatus according to claim 4, further comprising:
a console,
wherein the controller is configured to select one of the first and second operation modes in accordance with a command from the console.

7. An apparatus according to claim 1, further comprising:
a console; and
a flow rate controller configured to control a flow rate of the coolant in accordance with a command from the console.

8. An apparatus according to claim 1, wherein the apparatus is configured as an exposure apparatus that exposes a substrate to radiant energy.

9. A method of manufacturing a device, the method comprising:
exposing a substrate to radiant energy using a device manufacturing apparatus;
developing the exposed substrate; and
processing the developed substrate to manufacture the device,
wherein the device manufacturing apparatus includes a driving unit configured to perform driving for processing an object, a conduit through which a coolant that recovers heat generated by the driving unit flows, a cooler configure to cool the coolant that flows through the conduit, and a heater configured to heat the coolant cooled by the cooler so that the driving unit cooled by the heated coolant has a unit target temperature as a target temperature of the driving unit, the apparatus including:
a controller configured to heighten a cooler target temperature as a target temperature of the coolant downstream of the cooler and upstream of the heater, if it is determined, based on control information to control the driving unit, that a heat amount to be generated by the driving unit decreases,
wherein the apparatus is configured as an exposure apparatus that exposes a substrate to radiant energy.

* * * * *